US010243062B2

(12) United States Patent
Cheng et al.

(10) Patent No.: US 10,243,062 B2
(45) Date of Patent: Mar. 26, 2019

(54) FABRICATION OF A VERTICAL FIN FIELD EFFECT TRANSISTOR HAVING A CONSISTENT CHANNEL WIDTH

(71) Applicant: INTERNATIONAL BUSINESS MACHINES CORPORATION, Armonk, NY (US)

(72) Inventors: Kangguo Cheng, Schnectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/804,622

(22) Filed: Nov. 6, 2017

(65) Prior Publication Data

US 2018/0069097 A1 Mar. 8, 2018

Related U.S. Application Data

(63) Continuation of application No. 15/492,343, filed on Apr. 20, 2017, now Pat. No. 9,893,169, which is a (Continued)

(51) Int. Cl.
*H01L 29/78* (2006.01)
*H01L 29/66* (2006.01)
(Continued)

(52) U.S. Cl.
CPC .. *H01L 29/66666* (2013.01); *H01L 21/02164* (2013.01); *H01L 21/02238* (2013.01); *H01L 21/02255* (2013.01); *H01L 21/31111* (2013.01); *H01L 21/31116* (2013.01); *H01L 21/32105* (2013.01); *H01L 21/477* (2013.01); *H01L 27/0886* (2013.01); *H01L 29/045* (2013.01); *H01L 29/0657* (2013.01); *H01L 29/0847* (2013.01); *H01L 29/16* (2013.01); *H01L 29/49* (2013.01); *H01L 29/6653* (2013.01); *H01L 29/66795* (2013.01); *H01L 29/785* (2013.01); *H01L 29/7827* (2013.01); *H01L 29/93* (2013.01)

(58) Field of Classification Search
CPC ...... H01L 29/785; H01L 29/36; H01L 29/161
USPC .......................................... 257/401; 438/150
See application file for complete search history.

(56) References Cited

U.S. PATENT DOCUMENTS 7,642,144 B2    1/2010 Marshall et al.
7,951,657 B2    5/2011 Cheng et al.
(Continued)

OTHER PUBLICATIONS

List of IBM Patents or Patent Applications Treated as Related dated Nov. 6, 2017, 2 pages.

*Primary Examiner* — David Vu
*Assistant Examiner* — Brandon Fox
(74) *Attorney, Agent, or Firm* — Tutunjian & Bitetto, P.C.; Vazken Alexanian

(57) ABSTRACT

A method of forming a vertical fin field effect transistor having a consistent channel width, including forming one or more vertical fin(s) on the substrate, wherein the one or more vertical fin(s) have a tapered profile, oxidizing the one or more vertical fin(s) to form an oxide by consuming at least a portion of the vertical fin material, and removing the oxide from the one or more vertical fin(s), wherein the one or more vertical fin(s) include a tapered upper portion, a tapered lower portion and a straight channel portion there between.

18 Claims, 9 Drawing Sheets

Related U.S. Application Data continuation of application No. 15/226,823, filed on Aug. 2, 2016, now Pat. No. 9,837,405.

(51) Int. Cl.

| | |
|---|---|
| *H01L 27/088* | (2006.01) |
| *H01L 29/06* | (2006.01) |
| *H01L 21/321* | (2006.01) |
| *H01L 21/477* | (2006.01) |
| *H01L 29/04* | (2006.01) |
| *H01L 29/16* | (2006.01) |
| *H01L 29/49* | (2006.01) |
| *H01L 21/02* | (2006.01) |
| *H01L 21/311* | (2006.01) |
| *H01L 29/08* | (2006.01) |
| *H01L 29/93* | (2006.01) |

(56) References Cited

U.S. PATENT DOCUMENTS

| | | |
|---|---|---|
| 8,258,572 B2 | 9/2012 | Liaw |
| 8,362,574 B2 | 1/2013 | Kawasaki et al. |
| 8,362,575 B2 | 1/2013 | Kwok et al. |
| 8,525,186 B2 | 9/2013 | Cheng et al. |
| 8,637,849 B2 | 1/2014 | Deligianni et al. |
| 8,653,599 B1 | 2/2014 | Cheng et al. |
| 8,809,963 B2 | 8/2014 | Liaw |
| 8,975,144 B2 | 3/2015 | Kwok et al. |
| 9,040,428 B2 | 5/2015 | Hong et al. |
| 9,246,003 B2 | 1/2016 | Cheng et al. |
| 9,305,883 B2 | 4/2016 | Naczas et al. |
| 9,312,274 B1* | 4/2016 | Bryant ................ H01L 27/1211 |
| 9,385,050 B2 | 7/2016 | Haensch et al. |
| 2011/0165738 A1* | 7/2011 | Tezuka ................ H01L 27/1211 |
| | | 438/150 |
| 2011/0298041 A1 | 12/2011 | Renn |
| 2013/0230953 A1* | 9/2013 | Sudo .................... H01L 29/785 |
| | | 438/268 |
| 2014/0008736 A1 | 1/2014 | Li et al. |
| 2014/0159165 A1 | 6/2014 | van Dal et al. |
| 2017/0330878 A1 | 11/2017 | Pandey |
| 2018/0006024 A1* | 1/2018 | Anderson ............. H01L 27/088 |
| 2018/0006111 A1* | 1/2018 | Xie .................... H01L 29/0649 |

\* cited by examiner

FABRICATION OF A VERTICAL FIN FIELD EFFECT TRANSISTOR HAVING A CONSISTENT CHANNEL WIDTH

BACKGROUND

Technical Field

The present invention generally relates to formation of a vertical fin field effect transistor (vertical FinFET) having reduced vertical channel width variation, and more particularly to a method of fabricating a FinFET having a channel with straight sidewalls and facetted bottom source/drain.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular Si, commonly referred to as the fin with a gate on the fin, as compared to a MOSFET with a single gate parallel to the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present principles, a method is provided for forming a vertical fin field effect transistor having a consistent channel width. The method includes the step of forming one or more vertical fin(s) on the substrate, wherein the one or more vertical fin(s) have a tapered profile. The method further includes the steps of oxidizing the one or more vertical fin(s) to form an oxide by consuming at least a portion of the vertical fin material, and removing the oxide from the one or more vertical fin(s), wherein the one or more vertical fin(s) include a tapered upper portion, a tapered lower portion and a straight channel portion there between.

In accordance with an embodiment of the present principles, a method is provided for forming a vertical fin field effect transistor having a consistent channel width. The method includes the step of forming a plurality of vertical fins on a substrate. The method further includes the step of oxidizing at least one of the plurality of vertical fin(s) to form an oxide by consuming at least a portion of the vertical fin material to form a tapered upper portion, a tapered lower portion and a straight channel portion there between. The method further includes the step of removing at least a portion of the oxide to form an oxide spacer on the sidewalls of at least one of the plurality of vertical fins. The method further includes the step of introducing a dopant into at least a portion of the substrate between the plurality of vertical fins. The method further includes the step of removing the tapered upper portion of at least one of the plurality of vertical fins.

In accordance with another embodiment of the present principles, a vertical fin field effect transistor having a consistent channel width is provided. The vertical fin field effect transistor includes a plurality of vertical fins made of a single crystal semiconductor material, wherein the plurality of vertical fins include a tapered lower portion and a straight channel portion.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
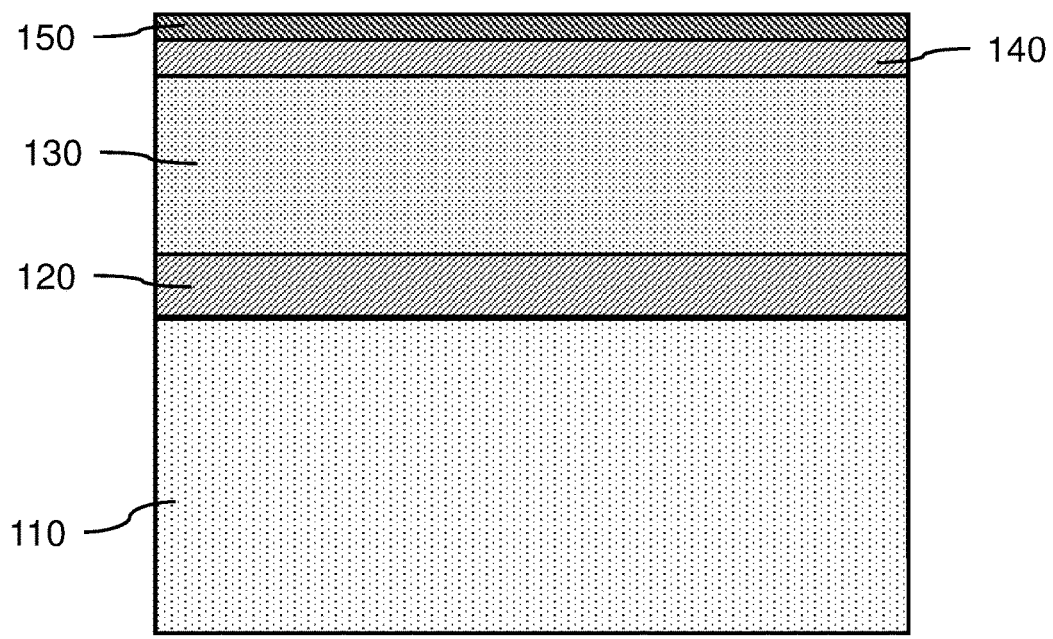
FIG. 1 is a cross-sectional side view of a fin template layer on a substrate, a mandrel layer on the fin template layer, a mandrel template layer on the mandrel layer and a mandrel mask layer on the mandrel template layer, in accordance with the present principles.

Principles and embodiments of the present disclosure relate generally to formation of vertical fins for utilization as channels for vertical fin field effect transistors (vertical FinFETs), where the vertical fins have straight fin sidewalls and a bottom source/drain with outwardly sloped sidewalls. The straight fin sidewalls can provide a consistent fin width that may provide improved FinFET device performance (e.g., reduced threshold voltage, $V_T$, variation) compared to vertical fins with a tapered sidewall.

Principles and embodiments of the present disclosure also relate generally to a method of fabricating a vertical FinFET having a uniform fin channel thickness utilizing a sacrificial oxidation step to preferentially remove material from specific crystal faces of the vertical fin. A facetted bottom portion having a <111> crystal orientation may be formed on the fin by the sacrificial oxidation.

Principles and embodiments of the present disclosure also relate generally to compensating for the tapered profile due to a lack of a suitable etch stop by subsequently removing material from wider portions of a vertical fin through selective etching of particular crystal faces.

Principles and embodiments of the present disclosure also relate generally to formation of a bottom source/drain from the facetted portion of the vertical fin through doping. The present principles and embodiments may also include removing an upper facetted portion of the vertical fin to leave a fin channel section having essentially vertical sidewalls.

Exemplary applications/uses to which the present principles can be applied include, but are not limited to: formation of complementary metal oxide silicon (CMOS) field effect transistors (FETs) formed by coupled FinFETs, digital gate devices (e.g., NAND, NOR, XOR, etc.), and memory devices (e.g., DRAM, SRAM, etc.).

In various embodiments, the materials and layers may be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions may be epitaxial processes, and the deposited material may be crystalline. In various embodiments, formation of a layer may be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional side view of a fin template layer on a substrate, a mandrel layer on the fin template layer, a mandrel template layer on the mandrel layer and a mandrel mask layer on the mandrel template layer is shown in accordance with the present principles.

In one or more embodiments, a substrate 110 may be a semiconductor or an insulator with an active surface semiconductor layer. The substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including insulating layers, for example, aluminum oxide ($Al_2O_3$), high-k oxides, and/or nitrides. In one or more embodiments, the substrate 110 may be a silicon wafer. In various embodiments, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In one or more embodiments, a fin template layer 120 may be formed on at least a portion of a surface of a substrate 110.

In various embodiments, a fin template layer 120 may be a hard mask layer for masking the substrate during transfer of a vertical fin pattern to the substrate 110. The fin template layer 120 may be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof, where the fin template layer 120 may include one or more layers. The fin template layer 120 may also act as an etch-stop layer for forming sacrificial mandrels from a mandrel layer.

In one or more embodiments, a mandrel layer 130 may be formed on at least a portion of the fin template layer 120, where the mandrel layer 130 may be blanket deposited on the fin template layer 120, for example, by CVD, PECVD, etc.

In various embodiments, mandrel layer 130 may be a sacrificial material that can be easily and selectively patterned and etched. The mandrel layer 130 may be amorphous silicon (a-Si), poly-silicon (p-Si), amorphous carbon (a-C), silicon-germanium (SiGe), or suitable combinations thereof.

In one or more embodiments, a mandrel template layer 140 may be formed on the mandrel layer 130, where the mandrel template layer may be a hard mask layer.

The mandrel template layer 140 may be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof, where the mandrel template layer 140 may include one or more layers.

In one or more embodiments, the mandrel mask layer 150 may be a lithographic resist material (e.g., a photo resist material, an e-beam resist material, etc.).

In one or more embodiments, the mandrel mask layer 150 may be a positive or negative resist material, for example, Poly (methyl methacrylate) (PMMA) or SU-8, or an electron-beam cured material, for example, hydrogen silsesquioxane (HSQ).

Figure 2:
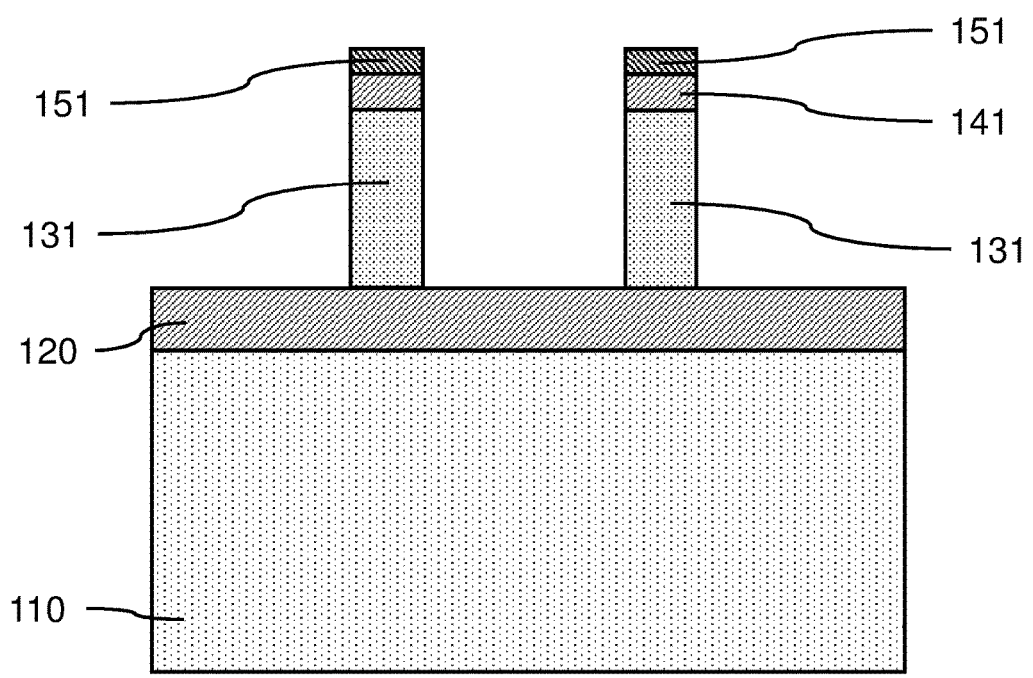
FIG. 2 is a cross-sectional side view of a plurality of sacrificial mandrels on a fin template layer with a mandrel mask and mandrel template on each of the sacrificial mandrels, in accordance with the present principles.

FIG. 2 is a cross-sectional side view of a plurality of sacrificial mandrels on a fin template layer with a mandrel mask and mandrel template on each of the sacrificial mandrels, in accordance with the present principles.

In various embodiments, a plurality of vertical fins may be formed by a sidewall image transfer (SIT) process, self-aligned double patterning (SADP), or self-aligned quadruple patterning (SAQP) to provide a tight pitch between vertical fins.

In one or more embodiments, the mandrel mask layer 150 may be patterned and developed to form one or more mandrel mask segments 151 on the surface of the mandrel template layer 140, where portions of the mandrel mask layer 150 may be removed to expose underlying portions of the mandrel template layer 140. In various embodiments, the mandrel mask layer 150 may be lithographically patterned and developed, as would be known in the art.

In various embodiments, the one or more mandrel mask segments 151 may form a mandrel pattern on the surface of the mandrel template layer 140, where the mandrel pattern may be transferred to the mandrel template layer 140 by removing the portions of the mandrel template layer exposed by forming the mandrel mask segments 151. The mandrel pattern may be determined by the resolution of the lithography techniques (e.g., ultraviolet (UV), deep ultraviolet (DUV), e-beam, etc.) used to pattern the mandrel mask layer 150.

In one or more embodiments, the mandrel mask segments 151 may have a width in the range of about 10 nm to about 60 nm, or in the range of about 12 nm to about 30 nm, where the mandrel width may define a distance between subsequently formed adjacent vertical fins.

In various embodiments, the pitch between adjacent mandrel mask segments 151 may be in the range of about 20 nm to about 100 nm, or in the range of about 20 nm to about 40 nm, or in the range of about 25 nm to about 30 nm, which may determine the pitch between vertical fins.

In one or more embodiments, the exposed portions of the mandrel template layer 140 may be removed by wet etching or by a dry plasma etch, where the dry plasma etch may be a directional reactive ion etch (RIE). Removal of the exposed portions of the mandrel template layer 140 may form one or more mandrel templates 141 below the mandrel mask segments 151, and expose underlying portions of the mandrel layer 130. The mandrel templates 141 may be used to transfer the mandrel pattern to the mandrel layer 130.

In one or more embodiments, the exposed portions of the mandrel layer 130 may be removed to form one or more sacrificial mandrels 131, where the exposed portions of the mandrel layer may be removed by a directional dry plasma etch, for example, a selective RIE. The one or more sacrificial mandrels 131 may be on the fin template layer 120, where portions of the fin template layer are exposed between the sacrificial mandrel(s) 131.

Figure 3:
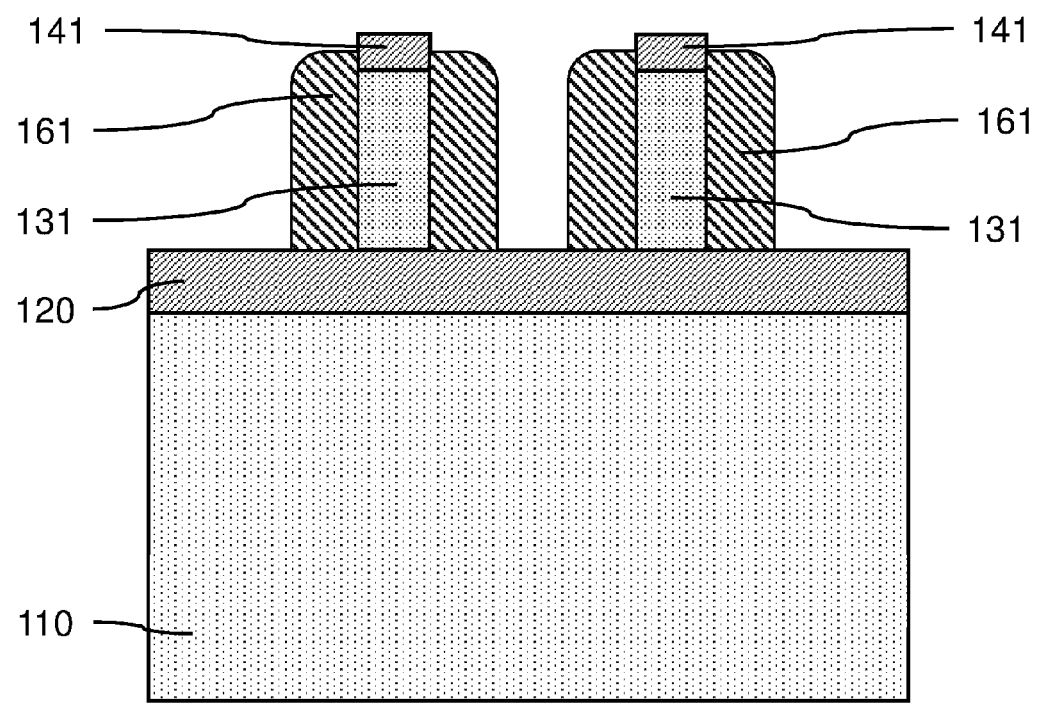
FIG. 3 is a cross-sectional side view of spacers formed on each of the sidewalls of the sacrificial mandrels, in accordance with the present principles.

FIG. 3 is a cross-sectional side view of spacers formed on each of the sidewalls of the sacrificial mandrels, in accordance with the present principles.

In one or more embodiments, spacers 161 may be formed on each of the one or more sacrificial mandrels 131.

In one or more embodiments, the spacers 161 may be formed by forming a spacer layer on the one or more sacrificial mandrels 131, where the spacer layer may be blanket deposited on each of the mandrel templates 141 on the sacrificial mandrels 131 and the exposed surfaces of the fin template layer 120. After deposition of the spacer layer, a portion of the spacer layer on the template layer 120 and the mandrel templates 141 may be removed by an etch-back process using a directional etch, for example, RIE to remove the portion the spacer layer on surfaces approximately perpendicular to the incident ion beam, while the spacer layer on the vertical sidewalls of the sacrificial mandrels 131 remain essentially unetched to form the spacers 161. In various embodiments, the mandrel mask segments 151 may be removed from the mandrel templates 141 before formation of the spacer layer.

In various embodiments, the spacer layer may be silicon oxide (SiO), silicon nitride (SiN), silicon oxynitride (SiON), or combinations thereof.

In various embodiments, the spacer layer may be formed by ALD, PEALD, CVD, PECVD, PVD, or combinations thereof. In various embodiments, the spacer layer may be conformally deposited on the sacrificial mandrels, for example, by ALD or PEALD, to accurately control the thickness of the spacer layer on the sidewalls of the sacrificial mandrels 131.

In various embodiments, the spacer layer may have a thickness in the range of about 4 nm to about 20 nm, or in the range of about 6 nm to about 15 nm, or in the range of about 8 nm to about 12 nm, where the thickness of the spacer layer may determine the pitch and/or width of subsequently formed vertical fins.

Figure 4:
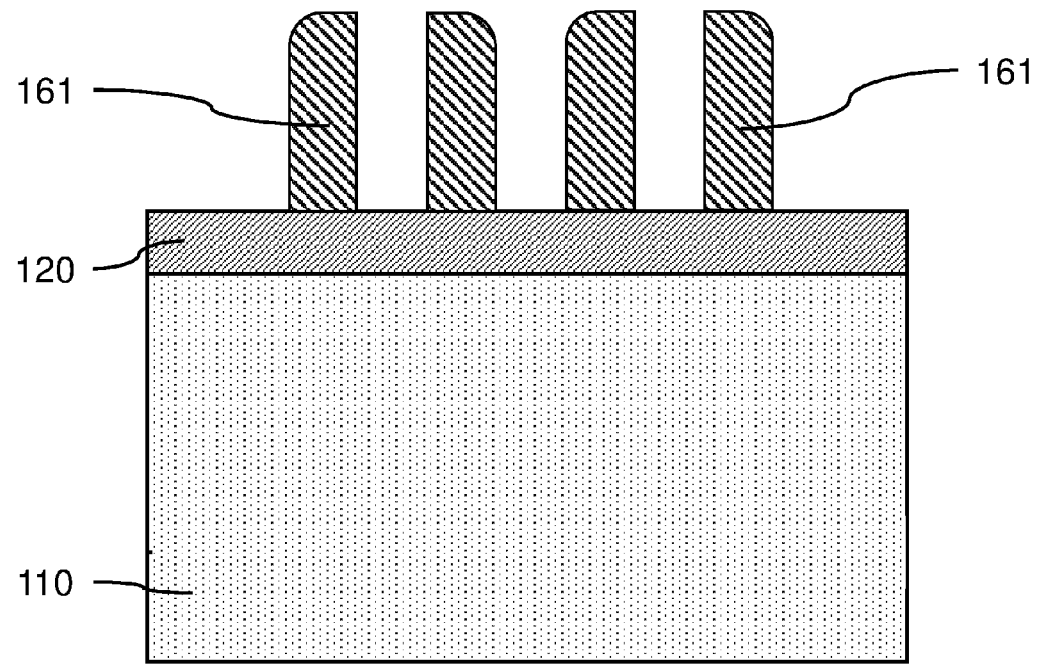
FIG. 4 is a cross-sectional side view of a plurality of spacers on a fin template layer, in accordance with the present principles.

FIG. 4 is a cross-sectional side view of a plurality of spacers on a fin template layer, in accordance with the present principles.

In one or more embodiments, the mandrel templates 141 and sacrificial mandrels 131 may be removed after the spacers are formed, where the mandrel templates 141 and sacrificial mandrels 131 may be removed by selective etching. The mandrel templates 141 and sacrificial mandrels 131 may be selectively removed, while the spacers 161 remain on the fin template layer 120 forming a fin pattern. The spacers 161 may be made of a different material from the mandrel templates 141 and sacrificial mandrels 131, so the mandrel templates 141 and sacrificial mandrels 131 may be selectively removed.

Figure 5:
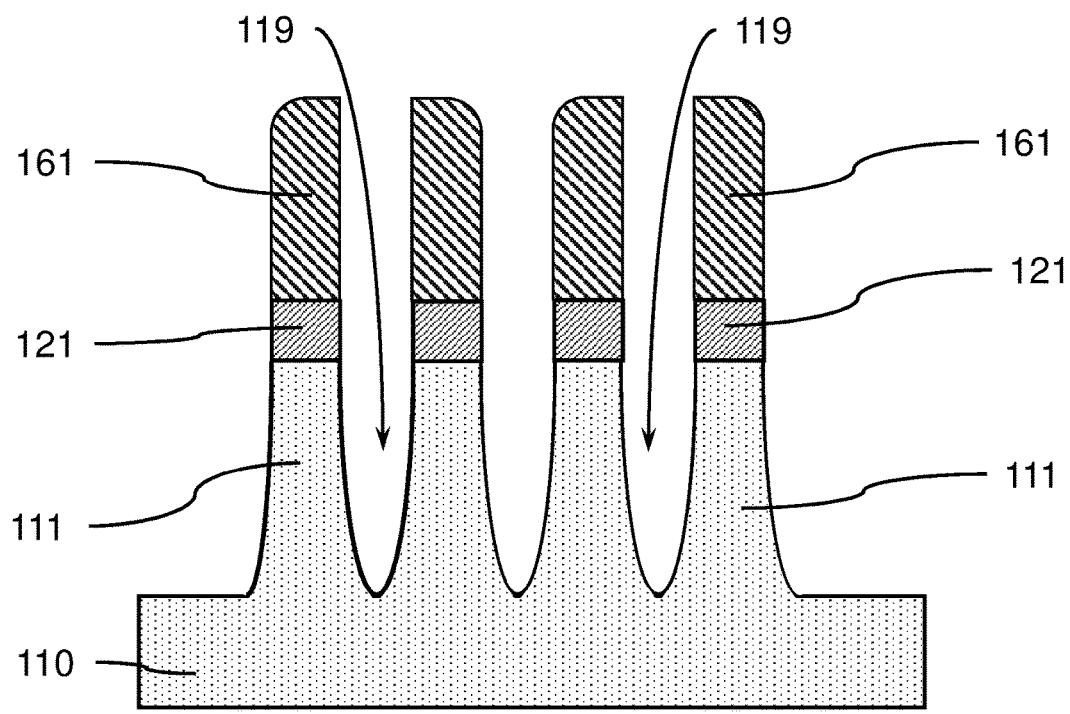
FIG. 5 is a cross-sectional side view of a spacer and fin template on each of a plurality of vertical fins formed from the substrate, in accordance with the present principles.

FIG. 5 is a cross-sectional side view of a spacer and fin template on each of a plurality of vertical fins formed from the substrate, in accordance with the present principles.

In one or more embodiments, the fin pattern formed by the spacers 161 may be transferred to the fin template layer 120 by removing the exposed portion of the fin template layer 120. In various embodiments, a portion of the fin template layer 120 may be removed to form a fin template 121 below each of the one or more spacers 161 by a directional RIE. Removal of the portions of the fin template layer 120 may expose portions of the underlying substrate 110 between the spacer(s) 161 and fin template(s) 121.

In one or more embodiments, the exposed portions of the substrate may be removed to form one or more vertical fin(s) 111, where the substrate and one or more vertical fin(s) 111 may be made of a semiconductor material. In various embodiments, trenches 119 may be etched into the substrate 110 between the spacer(s) 161 and fin template(s) 121 to leave free-standing vertical fin(s) 111, where the substrate 110 may be etched by a directional RIE. The removal of the substrate material may form vertical fin(s) 111 with a tapered profile having a greater width at the base of the vertical fin(s) and a narrower width at the top of the fin(s), where the tapered profile may be produced as an aspect of the etching process. The trenches 119 may have a curved bottom forming a concave groove between the vertical fin(s) 111, where the base of the vertical fin(s) 111 may flare out along the curve of the trench bottom.

In various embodiments, the vertical fin 111 may have a width at the top surface in the range of about 8 nm to about 12 nm, and a width at the base of the vertical fin in the range of about 11 nm to about 18 nm, where the vertical fin width may vary between the width at the top surface and the width at the base along the height of the sidewall.

In non-limiting exemplary embodiments, the substrate 110 may be a single crystal silicon wafer or a single crystal silicon-germanium wafer, or the substrate may include a single crystal silicon or single crystal silicon-germanium active layer at the surface of the substrate 110 from which a plurality of vertical fins may be formed.

Figure 6:
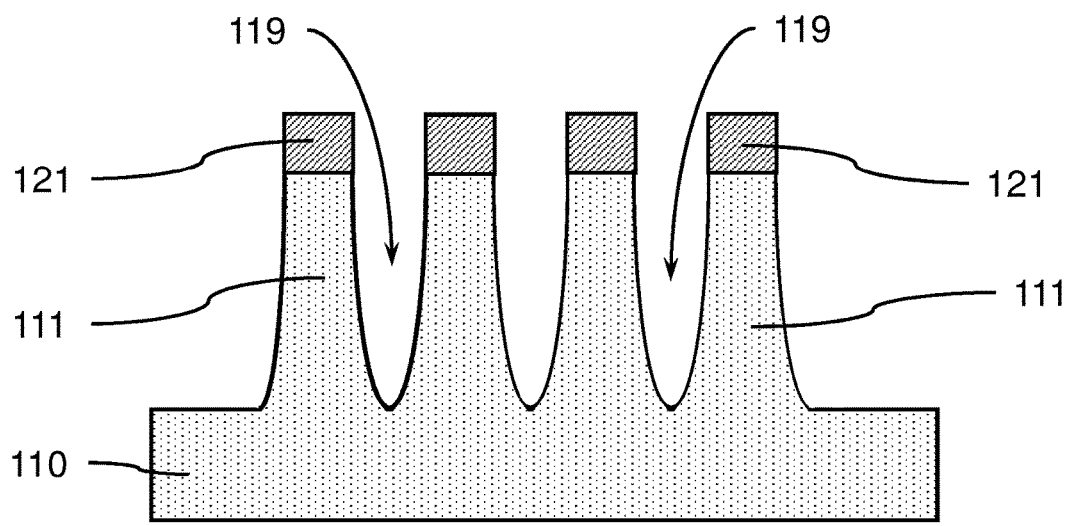
FIG. 6 is a cross-sectional side view of a plurality of vertical fins with intervening trenches having curved bottoms on a region of the substrate, in accordance with the present principles.

FIG. 6 is a cross-sectional side view of a plurality of vertical fins with intervening trenches having curved bottoms on a region of the substrate, in accordance with the present principles.

In one or more embodiments, the spacer(s) 161 may be removed from the top surface of the fin template(s) 121 on one or more vertical fin(s) 111. The spacer(s) 161 may be removed, for example, by an isotropic dry etch, a selective RIE process, or a selective wet etch. The underlying fin template(s) 121 may act as an etch stop. The exposed fin template(s) 121 may then be removed by a separate selective RIE or wet etch to expose the underlying vertical fin(s) 111. In various embodiments, the fin template(s) 121 may remain on the vertical fin(s) 111 after the spacer(s) 161 are removed.

Figure 7:
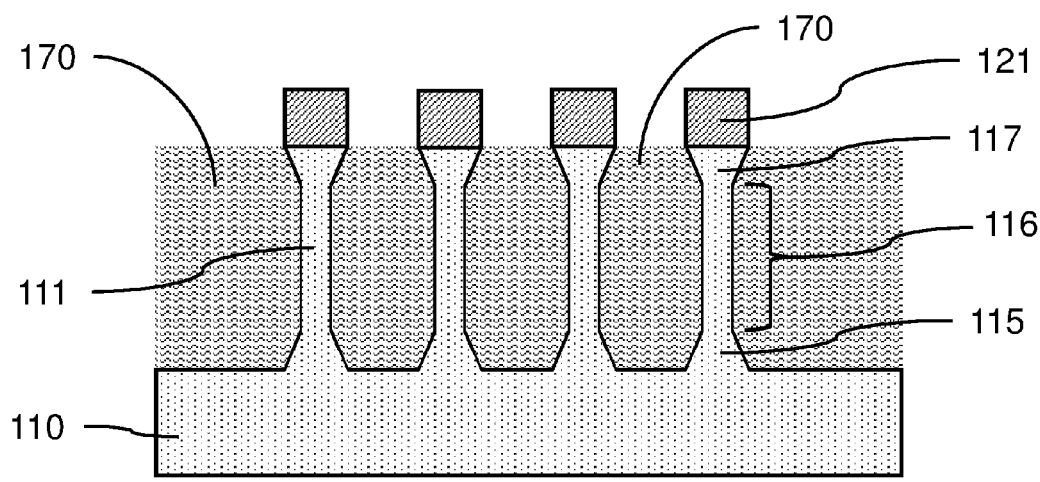
FIG. 7 is a cross-sectional side view of an oxide formed on the vertical fins, in accordance with the present principles.

FIG. 7 is a cross-sectional side view of an oxide formed on the vertical fins, in accordance with the present principles.

In one or more embodiments, an oxide 170 may be formed on the vertical fins 111, where oxide may fill the trench(es) 119 between the vertical fins 111. The oxide 170 may be a thermal oxide grown on the vertical fins 111, where the thermal oxide may consume a portion of the vertical fin(s) 111, or the oxide 170 may be an oxide layer deposited on the sidewalls of the vertical fins 111 followed by a thermal oxidation. The deposited oxide layer can be formed by any suitable deposition technique such as CVD, PECVD, ALD, PEALD, or combinations thereof.

In various embodiments, the thermal oxidation may be a wet oxidation or a dry oxidation of a semiconductor material. The growth of the thermal oxide may preferentially consume semiconductor material from particular crystal faces of a crystalline vertical fin 111 to form facetted faces on the vertical fin. Preferential removal of vertical fin material along the height of a vertical fin 111 may reduce the variation in width along at least a portion of the height of a vertical fin.

In various embodiments, the vertical fin 111 may have a width at the top of a straight channel portion 116 in the range of about 6 nm to about 10 nm, and a width at the bottom of the straight channel portion 116 that is substantially the same as the width at the top of the straight channel portion, such that the variation in width difference is less than 1.5 nm along the height of the sidewall, which provides a consistent fin width.

In one or more embodiments, a tapered profile of one or more vertical fin(s) 111 may be straightened along a preferential crystal face (e.g., {100} or {110}) due to higher reaction rates at the particular crystal faces during oxidation. A lower portion 115 of the vertical fin may retain a tapered profile, where the lower portion 115 of the vertical fin 111 may have a pyramidal or isosceles trapezoid prism shape. The faces of the lower portion 115 of the vertical fin may be exposed {111} crystal planes. In various embodiments, the upper portion 117 and lower portion 115 may be preferentially etched along crystal faces that produce a predetermined tapered profile.

Without intending to be limited by theory, it is believed that for a typical silicon wafer, the surface of the wafer can have a {001} crystal plane. The vertical fin sidewalls may be either {110} or {100} crystal planes, depending on the patterning direction/alignment and wafer orientation (a wafer may have a flat edge indicating a particular crystal face). After formation of a vertical fin 111 by RIE, the fin sidewalls are not straight (i.e., they are tapered), so the fin sidewalls deviate from the {110} or {100} planes. During thermal oxidation, crystal planes that are not {110} or {100} can be oxidized at a much faster rate, resulting in removal of material from the other non-{110}, -{100} crystal planes, rendering the sidewalls essentially vertical {110} or {100} crystal planes. In comparison, towards the top of the vertical fin(s) 111, the presence of the fin template 121 can slow down the thermal oxidation of the underlying vertical fin material, such that {111} crystal planes are formed at the top portion 117 of the vertical fin 111. At the bottom of the vertical fin 111, the large volume of substrate material can cause a reduction in etching rate for the lower portion 115, resulting in the formation of {111} crystal planes. A tapered upper portion 117, a tapered lower portion 115, and a straight channel portion 116, may thereby be formed.

In one or more embodiments, and upper portion 117 of one or more vertical fin(s) 111 may obtain a tapered profile, where the upper portion 117 of the vertical fin 111 may have a pyramidal or isosceles trapezoid prism shape. The faces of the upper portion 117 of the vertical fin may be exposed {111} crystal planes.

Figure 8:
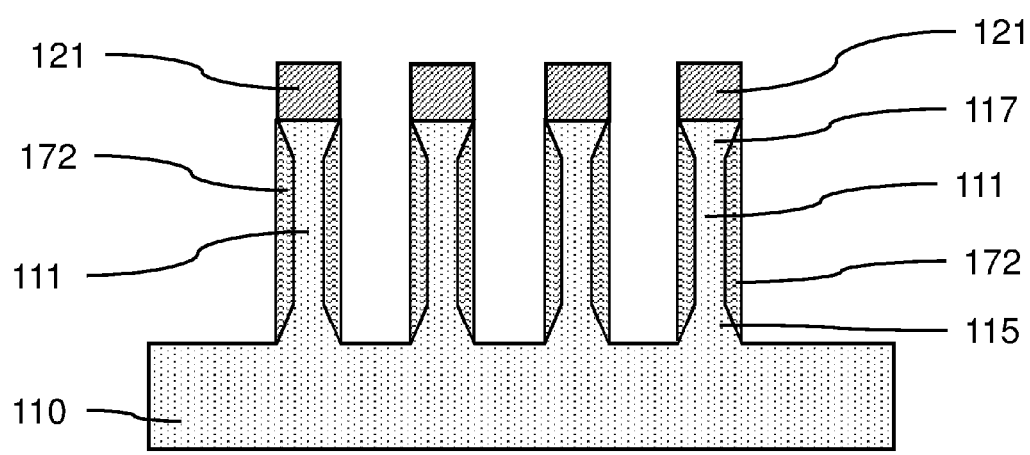
FIG. 8 is a cross-sectional side view of oxide spacers on the sidewalls of the vertical fins and tapered upper and lower portions of the vertical fins, in accordance with the present principles.

FIG. 8 is a cross-sectional side view of oxide spacers on the sidewalls of the vertical fins and tapered upper and lower portions of the vertical fins, in accordance with the present principles.

In one or more embodiments, a portion of the oxide 170 may be removed from between the vertical fins 111, where the fin template(s) 121 may act as etch masks. The portion of the oxide 170 may be removed by a directional dry plasma etch (e.g., RIE), where removal of the portion leaves oxide spacers 172 on the sidewalls of the vertical fins 111. The oxide spacers 172 may have a thickness defined by the width of the fin template 121 and depth of the recess between the upper portion 117 and lower portion 115 of the vertical fin 111 created by the oxidation.

In various embodiments, the facetted lower portion 115 and straight channel portion 116 of the vertical fin(s) 111 may provide an extension resistance in the range of about 50 ohm/μm to about 100 ohm/μm. In various embodiments, the facetted lower portion 115 and straight channel portion 116 of the vertical fin(s) 111 may provide a gate-to-source/drain capacitance in the range of about 0.05 fF/μm (i.e., femto farads) to about 0.1 fF/μm.

Figure 9:
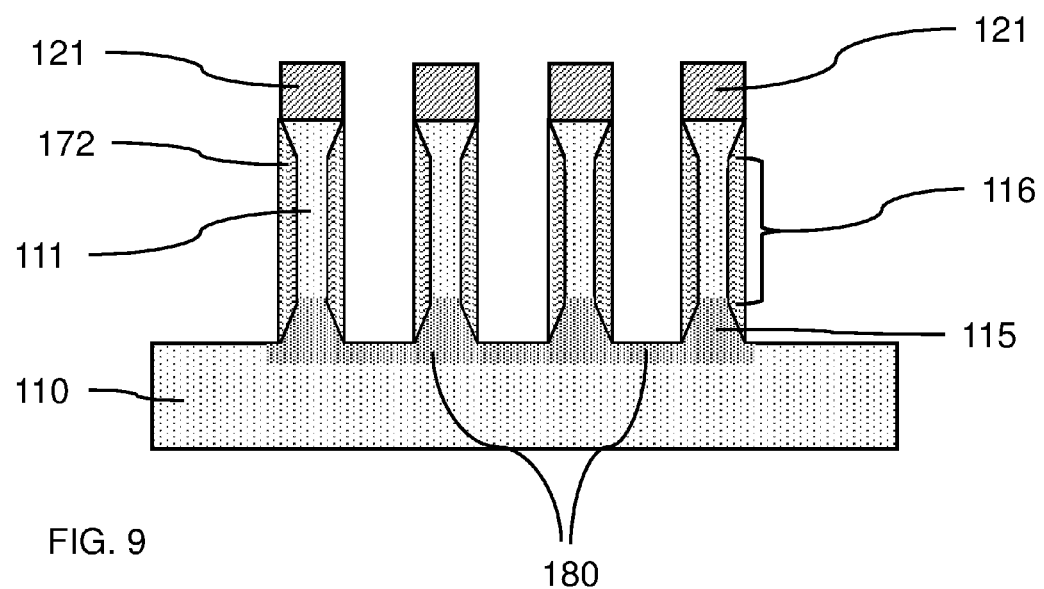
FIG. 9 is a cross-sectional side view of a bottom source/drain formed in the substrate and lower portions of the vertical fins, in accordance with the present principles.

FIG. 9 is a cross-sectional side view of a bottom source/drain formed in the substrate and lower portions of the vertical fins, in accordance with the present principles.

In one or more embodiments, a dopant may be introduced into the lower portions 115 of the vertical fins and a surface region of the substrate 110, where the dopant may be introduced, for example, by ion bombardment or gas phase doping, and the dopants may be activated by a thermal anneal to form a bottom source/drain 180. The oxide spacers 172 may protect the sidewalls of the vertical fin(s) 111 from introduction of the dopant. The bottom source/drain 180 may extend beneath one or more vertical fin(s) 111, where the bottom source/drain 180 may electrically couple a plurality of vertical fins 111 into a single multi-fin device. The dopant may extend partially from the lower portion 115 into the straight channel portion 116 of the vertical fin(s) 111.

In one or more embodiments, the dopants may be incorporated into the substrate and vertical fin by a suitable doping technique, including but not limited to, ion implantation, gas phase doping, gas cluster ion beam doping, solid phase doping, liquid phase doping, in-situ doped epitaxy, or any suitable combination of these doping techniques. In various embodiments, a thermal anneal can be performed to activate dopants and/or diffuse dopants upwards into the lower portion 115 of adjacent vertical fin(s) 111 to obtain the later formed gate structure-to-source/drain overlap. The thermal anneal process can be laser anneal, rapid anneal, flash anneal, furnace anneal, microwave anneal, or any suitable combination of these techniques, where the temperature and duration of the thermal anneal can be sufficient to provide migration and activation of the dopant without damage to other device structures.

Figure 10:
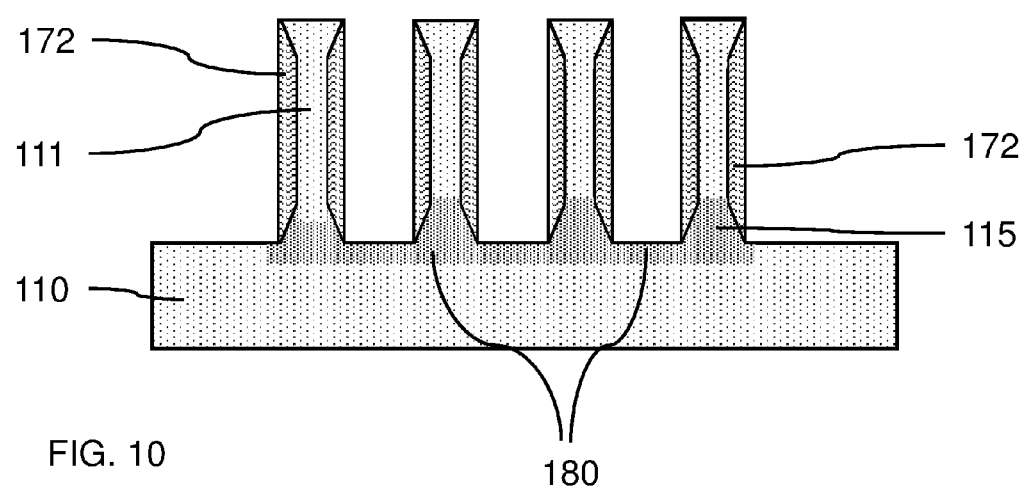
FIG. 10 is a cross-sectional side view of vertical fins with an exposed top surface after removal of the fin templates, in accordance with the present principles.

FIG. 10 is a cross-sectional side view of vertical fins with an exposed top surface after removal of the fin templates, in accordance with the present principles.

In one or more embodiments, the fin templates 121 may be removed from the tops of the vertical fins by a selective etch, where the selective etch may be a selective RIE or a selective wet etch for the material of the fin templates. The oxide spacers 172 may protect the upper portion 117, lower portion 115, and vertical fin sidewalls of the straight channel portion 116 during removal of the fin templates.

Figure 11:
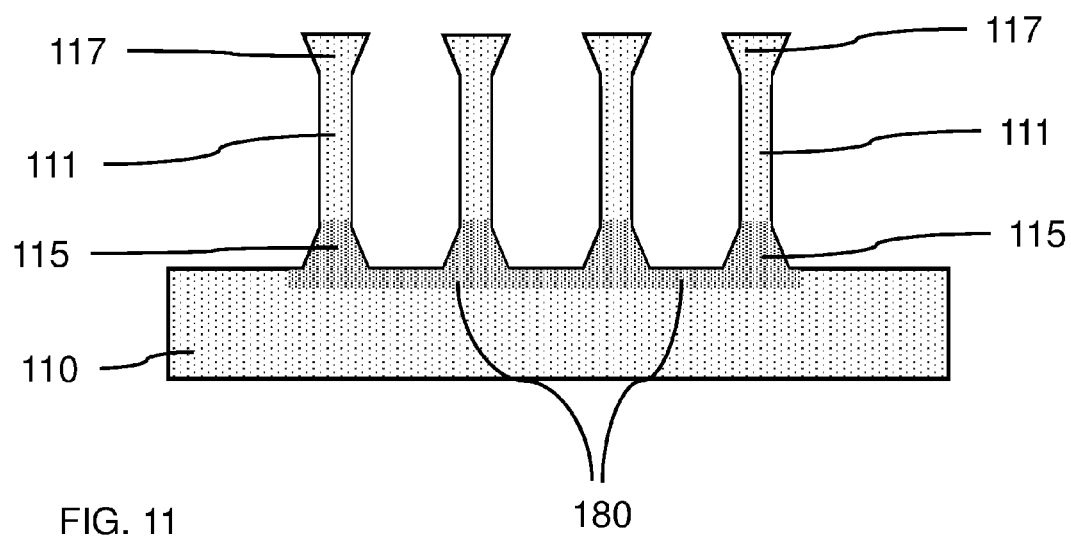
FIG. 11 is a cross-sectional side view of a plurality of vertical fins after removal of the oxide spacers, in accordance with the present principles.

FIG. 11 is a cross-sectional side view of a plurality of vertical fins after removal of the oxide spacers, in accordance with the present principles.

In one or more embodiments, the oxide spacers 172 may be removed from the upper portion 117, lower portion 115 and straight channel portion 116 of the vertical fin(s) 111, where the oxide spacers 172 may be removed by a selective isotropic etch (e.g., wet etch). Removal of the oxide spacers 172 may expose the straight sidewalls of the straight channel portion 116, and the tapered sidewalls of the upper portion 117 and lower portion 115.

Figure 12:
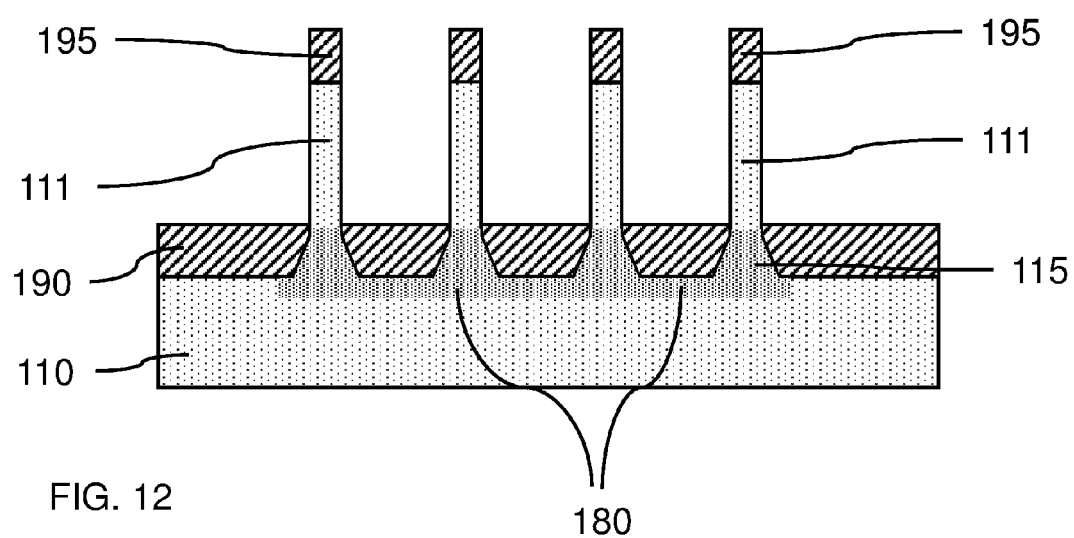
FIG. 12 is a cross-sectional side view of the vertical fins after removal of the tapered upper portion of the vertical fins and formation of a bottom spacer layer and fin caps on the top surface of the vertical fins, in accordance with the present principles.

FIG. 12 is a cross-sectional side view of the vertical fins after removal of the tapered upper portion of the vertical fins and formation of a bottom spacer layer and fin caps on the top surface of the vertical fins, in accordance with the present principles.

In one or more embodiments, the upper portion 117 of the vertical fins 111 may be removed to eliminate the variation of fin width at the upper portion 117. In various embodiments, the upper portion 117 may be removed by forming a gap fill layer between the vertical fins 111, where the gap fill layer may be a sacrificial material (e.g., a flowable oxide). The gap fill layer may be planarized to expose the top surface of each of the vertical fin(s) 111, and the upper portion 117 may be removed by a selective etch (e.g., RIE) to leave the straight channel portion 116 of the vertical fin(s) 111. The gap fill layer may be removed by known processes after removal of the upper portion 117 of the vertical fin(s) 111.

In one or more embodiments, removal of the tapered upper portion 117 provides a straight channel for a vertical FinFET device upon which a gate structure may subsequently be formed, where the gate structure can be over a straight channel portion of the vertical fin 111 having a uniform width (e.g., width difference less than 1.5 nm).

In one or more embodiments, a bottom spacer layer 190 and fin caps 195 may be formed on the exposed surfaces of the substrate 110, bottom source/drain 180, and lower portion 115 of the vertical fin(s). The bottom spacer layer 190 and fin caps 195 may be formed by a directional ion deposition, for example, PVD or a gas cluster ion beam deposition (GCIB), where the bottom spacer layer 190 and fin caps 195 may be formed on the exposed lateral surfaces of the substrate, bottom source/drain 180, and vertical fin(s) 111, but not deposited on the vertical sidewalls of the vertical fin(s) 111. Portions of the bottom spacer layer 190 and fin cap 195 material that may deposit on the sidewalls of the vertical fin(s) 111 may be removed from the sidewalls using a non-directional etch.

In one or more embodiments, the bottom spacer layer 190 and fin caps 195 may be an oxide, for example, silicon oxide (SiO) or a high-k metal oxide, or an insulating nitride, including but not limited to silicon nitride (SiN), or a silicon oxynitride (SiON), or combinations thereof.

In various embodiments, the bottom spacer layer 190 may be between vertical fin(s) 111 and cover at least a portion of the lower portion 115 of the vertical fin 111, where the lower portion 115 may form at least a part of the bottom source/drain 180. The top surface of the bottom spacer layer 190 may be below, at, or above the level of the dopant in the bottom source/drain 180, where the bottom spacer layer 190 may physically separate and electrically isolate the bottom source/drain 180 from a subsequently formed gate structure.

In various embodiments, the overlap of the bottom source/drain(s) 180 with a gate structure may be adjusted by varying the height the dopants diffuse into the straight channel portion 116 relative to the height of the bottom spacer layer 190, where the top surface of the bottom spacer layer 190 may be below, at, or above the level of the dopant in the straight channel portion 116 and/or bottom source/drain 180.

Figure 13:
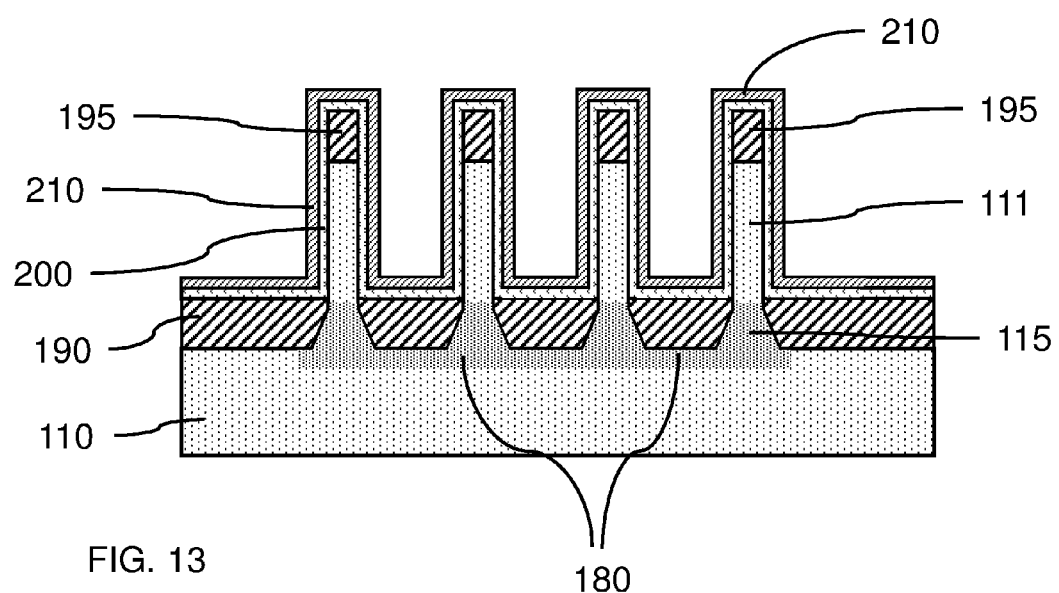
FIG. 13 is a cross-sectional side view of gate dielectric layer and a work function layer on the bottom spacer layer, fin caps, and vertical fin sidewalls, in accordance with the present principles.

FIG. 13 is a cross-sectional side view of gate dielectric layer and a work function layer on the bottom spacer layer, fin caps, and vertical fin sidewalls, in accordance with the present principles.

In one or more embodiments, a gate dielectric layer 200 may be formed on at least a portion of the bottom spacer layer and on one or more vertical fin(s) 111 and fin cap(s) 195. In one or more embodiments, the gate dielectric layer 200 may be formed by a conformal deposition, for example, ALD, PEALD, CVD, PECVD, or combinations thereof.

In one or more embodiments, the gate dielectric layer 200 may be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 200 may be a high-K dielectric material that may include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material may further include dopants such as lanthanum and/or aluminum. The stoichiometry of the high-K compounds may vary.

In various embodiments, the dielectric layer 200 may have a thickness in the range of about 1 nm to about 5 nm, or may have a thickness in the range of about 2 nm to about 3 nm.

In one or more embodiments, a work function layer 210 may be formed on at least a portion of the gate dielectric layer 200, where the work function layer 210 may be formed on the exposed portion(s) of the gate dielectric layer 200. The work function layer 210 may be formed on the gate dielectric layer 200 to adjust the electrical properties of the gate electrode. In various embodiments, the work function layer 210 may be optional.

In various embodiments, a work function layer 210 may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 210 may include multiple layers of work function materials, for example, a work function layer 210 may be a TiN/TiC stack.

In one or more embodiments, the work function layer 210 may be formed by a conformal deposition, for example, ALD, PEALD, CVD, PECVD, or combinations thereof.

In various embodiments, the work function layer 210 may have a thickness in the range of about 3 nm to about 11 nm, or may have a thickness in the range of about 5 nm to about 8 nm.

Figure 14:
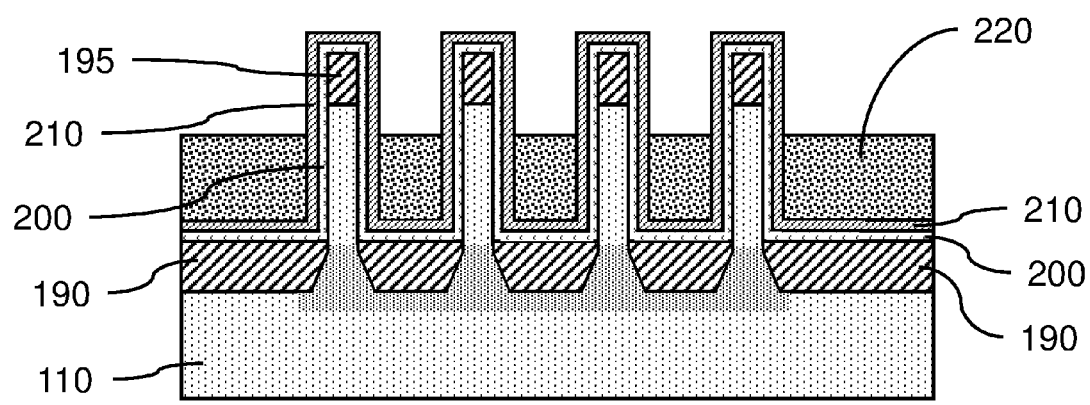
FIG. 14 is a cross-sectional side view of a gate structure formed on the at least a portion of one or more vertical fin(s), in accordance with the present principles.

FIG. 14 is a cross-sectional side view of a gate structure formed on the at least a portion of one or more vertical fin(s), in accordance with the present principles.

In one or more embodiments, a gate fill layer 220 may be formed on the gate dielectric layer 200 and/or work function layer 210 if present, where the gate fill layer 220 may fill in the space(s) between the vertical fins 111. The gate fill layer 220, gate dielectric layer 200, and optionally the work function layer 210, may form a gate structure on one or more vertical fin(s) 111, where the gate fill layer 220 and work function layer 210 may form a conductive gate electrode.

In various embodiments, the gate fill layer 220 may be blanket deposited on the exposed surfaces of the gate dielectric layer 200 and/or work function layer 210 on the vertical fin(s) 111. The formed gate fill layer 220 may extend above the top surface of the work function layer 210 on the fin cap(s) 195, where the gate fill layer material above the top surfaces of the work function layer 210 may be at least partially removed by a CMP to provide a flat, uniform surface. In various embodiments, the gate fill layer 220 may be etched back to reduce the height of the gate fill layer 220 forming the gate structure, where the top surface of the gate fill layer may be reduced below the top of the vertical fin(s) 111.

In various embodiments, the gate fill layer 220 may be a conductive metal, where the metal may be tungsten (W), titanium (Ti), molybdenum (Mo), cobalt (Co), or a conductive carbon material (e.g., carbon nanotube, graphene, etc.), or any suitable combinations thereof.

Figure 15:
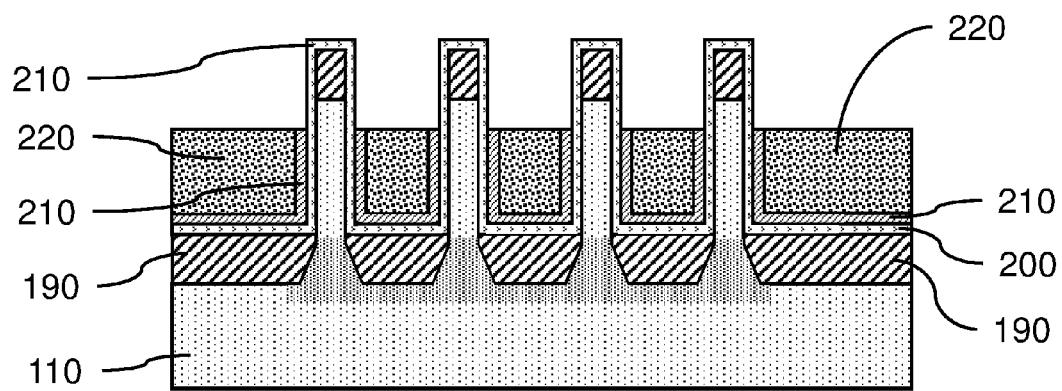
FIG. 15 is a cross-sectional side view of the work function layer etched back to the gate fill layer, in accordance with the present principles.

FIG. 15 is a cross-sectional side view of the work function layer etched back to the gate fill layer, in accordance with the present principles.

In one or more embodiments, the work function layer 210 may be partially removed to expose the underlying gate dielectric layer 200 on the fin cap(s) 195. The work function layer 210 may be partially removed by a selective etch (e.g., RIE), where the work function layer 210 not covered by the gate fill layer 220 may be removed.

Figure 16:
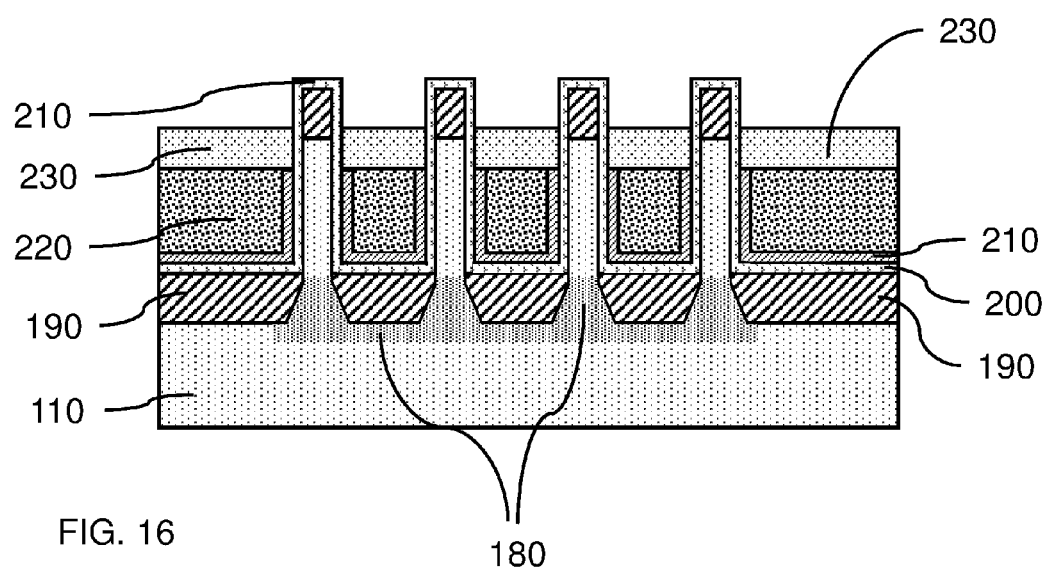
FIG. 16 is a cross-sectional side view of top spacer layer formed on the gate fill layer, in accordance with the present principles.

FIG. 16 is a cross-sectional side view of top spacer layer formed on the gate fill layer, in accordance with the present principles.

In one or more embodiments, a top spacer layer 230 may be formed on the exposed surfaces of the gate fill layer 220, work function layer 210, and gate dielectric layer 200. The top spacer layer 230 may be blanket deposited, for example, by CVD, PVD, or a gas cluster ion beam deposition (GCIB), where the top spacer layer 230 may be formed on the exposed lateral surfaces of the gate fill layer 220, but not deposited on the vertical walls of the gate dielectric layer 200. Portions of the top spacer layer 230 that may deposit on the gate dielectric layer 200 may be removed by a non-directional etch (e.g., wet etch), where the etch may reduce the height of the top spacer layer 230.

In one or more embodiments, the top spacer layer 230 may be an oxide, for example, silicon oxide (SiO) or a high-k metal oxide, or an insulating nitride, including but not limited to silicon nitride (SiN), or a silicon oxynitride (SiON), or a combination thereof.

In various embodiments, the top spacer layer 230 may be between vertical fin(s) 111 and cover at least a portion of the gate dielectric layer 210 on the vertical fin(s) 111. The top surface of the top spacer layer 230 may be above the level of the top surface of the vertical fin(s) 111, and may physically separate and electrically isolate the gate structure from a subsequently formed top source/drain.

Figure 17:
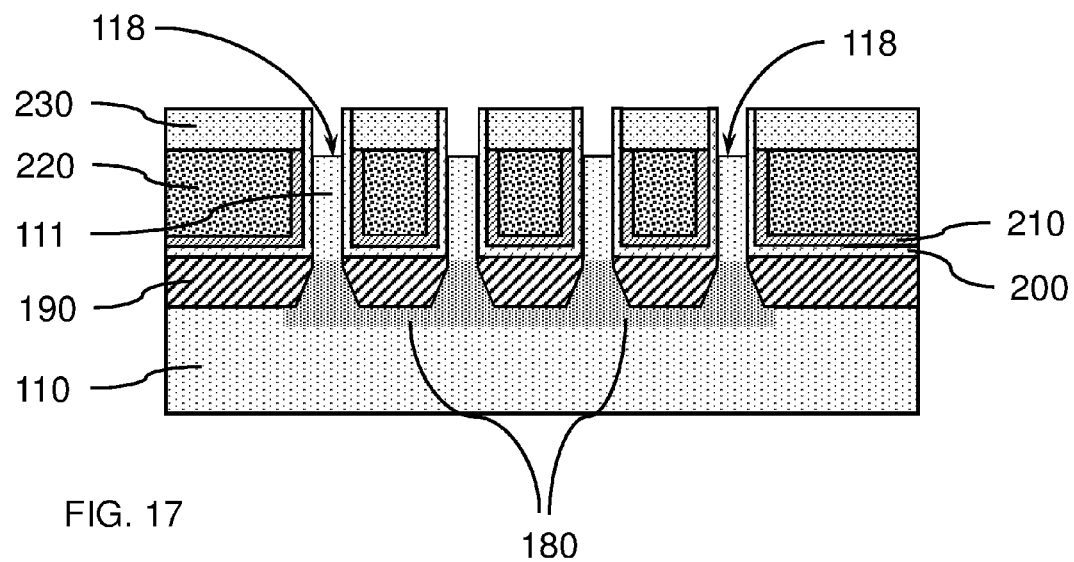
FIG. 17 is a cross-sectional side view of top spacer layer formed on the gate fill layer with the top surface of the vertical fin exposed after removal of the fin caps, in accordance with the present principles.

FIG. 17 is a cross-sectional side view of top spacer layer formed on the gate fill layer with the top surface of the vertical fin exposed after removal of the fin caps, in accordance with the present principles.

In one or more embodiments, the gate dielectric layer 210 and fin caps 195 may be removed to expose the top surface 118 of the vertical fin(s) 111. In various embodiments, the gate dielectric layer 210 and fin caps 195 above the level of the surface of the top spacer layer 230 may be removed by a CMP to expose the fin caps 195 below the level of the surface of the top spacer layer 230. The fin caps 195 below the level of the surface of the top spacer layer 230 may be removed by a selective etch, for example, a selective RIE. In various embodiments, the exposed portion of the gate dielectric layer 210 may be removed by a selective RIE to expose the underlying fin caps 195, and the exposed fin caps 195 may be removed by a subsequent selective RIE.

In various embodiments, an upper portion of the vertical fin 111 may be recessed, for example, by RIE, to reduce the height of the vertical fin 111. The top surface 118 of the straight channel portion 116 may be reduced to the level of the gate fill layer 220 and work function layer 210, or below the level of the gate fill layer 220 and work function layer 210, so a subsequently formed source/drain may at least partially overlap with the gate structure.

Figure 18:
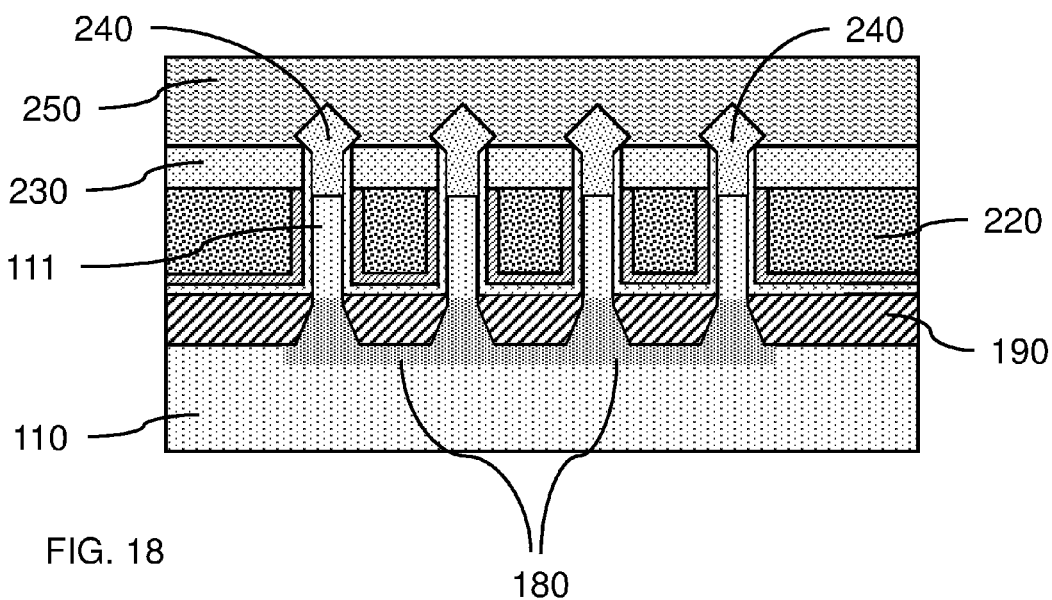
FIG. 18 is a cross-sectional side view of top source/drains formed on the exposed surfaces of the vertical fins, and an interlayer dielectric over the top source/drains, in accordance with the present principles.

FIG. 18 is a cross-sectional side view of top source/drains formed on the exposed surfaces of the vertical fins, and an interlayer dielectric over the top source/drains, in accordance with the present principles.

In one or more embodiments, a top source/drain 240 may be formed on the exposed top surface 118 of each of the one or more vertical fin(s) 111, where the top source/drain(s) may be formed by epitaxial growth on the vertical fin(s) 111. The top source/drains 240 may be epitaxially grown on the each of the vertical fins 111, such that there may be a physically and electrically separate top source/drain 240 on each of the vertical fin(s) 111, which may be electrically coupled together by subsequently formed electrical contacts. In various embodiments, the top source/drains 240 may be epitaxially grown on the each of the vertical fins 111 until the top source/drains 240 grow together to form a merged top source/drain 240 that electrically couples a plurality of vertical fins together. The top source/drain 240 may be doped in-situ during formation, or ex-situ by dopant implantation or diffusion after formation.

In various embodiments, the overlap of the top source/drain(s) 240 with the gate structure, as well as the overlap of the bottom source/drain(s) 180 may be independently tuned by varying the thermal diffusion of dopants in the bottom source/drain 180, compared to varying the etch back of the straight channel portion 116 for forming the top source/drain(s) 240.

In various embodiments, an interlayer dielectric (ILD) 250 may be formed on the top spacer layer 230 and top source/drain(s) 240 to form an insulating dielectric cover over the top source/drains.

In one or more embodiments, the interlayer dielectric 250 may be a silicon oxide (SiO) or a low-k dielectric material. In various embodiments, a low-k dielectric material may be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof.

In various embodiments, the interlayer dielectric 250 may be blanket deposited on the top spacer layer 230 and top source/drain(s) 240. In various embodiments, the interlayer dielectric 220 may be formed by CVD, LPCVD, or spun on. Vias and electrical contacts may be formed in the ILD to the top source/drain(s) 240, bottom source/drains 180, and gate electrode.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical fin field effect transistor having a consistent channel width, comprising:
    forming one or more vertical fin(s) on a substrate, wherein the one or more vertical fin(s) have a tapered profile;
    oxidizing the one or more vertical fin(s) to form an oxide by consuming at least a portion of the vertical fin material; and
    removing the oxide from the one or more vertical fin(s), wherein the one or more vertical fin(s) include a tapered upper portion, a tapered lower portion, and a straight channel portion there between, wherein the exposed faces of the tapered lower portion of the one or more vertical fin(s) are $\{111\}$ crystal planes.

2. The method of claim 1, wherein oxidizing the one or more vertical fin(s) involves a thermal oxidation.

3. The method of claim 1, wherein exposed sidewalls of the straight channel portion of each of the one or more vertical fins are $\{110\}$ crystal planes.

4. The method of claim 1, further comprising introducing a dopant into at least a portion of the substrate and tapered lower portion to form a bottom source/drain.

5. The method of claim 1, further comprising removing the tapered upper portion of the one or more vertical fin(s).

6. The method of claim 5, further comprising forming a top source/drain on each of the one or more vertical fins.

7. The method of claim 6, wherein the top source/drain on each of the one or more vertical fins grow together to form a merged top source/drain.

8. The method of claim 7, further comprising forming a gate structure on each of the one or more vertical fin(s).

9. A method of forming a vertical fin field effect transistor having a consistent channel width, comprising:
    oxidizing a vertical fin to form an oxide by consuming a portion of the sidewalls of the vertical fin materials, wherein the vertical fin is single crystal silicon, and the preferentially consumed crystal face is the $\{100\}$ crystal face; and
    removing the oxide to form a straight channel portion.

10. The method of claim 9, wherein the oxidation preferentially consumes particular crystal faces of the vertical fin.

11. The method of claim 10, further comprising forming a gate structure on the vertical fin.

12. The method of claim 10, wherein oxidizing the vertical fin involves a wet oxidation.

13. A method of forming a vertical fin field effect transistor having a consistent channel width, comprising:
    oxidizing a vertical fin to form an oxide by consuming a portion of the sidewalls of the vertical fin material to form a tapered upper portion, a tapered lower portion and a straight channel portion there between, wherein the vertical fin is single crystal silicon, and the consumed sidewalls are the $\{100\}$ crystal face;
    forming a bottom source/drain in the tapered lower portion; and
    removing the oxide to form a straight channel portion.

14. The method of claim 13, further comprising, forming a bottom spacer layer on the tapered lower portion.

15. The method of claim 14, further comprising, forming a gate structure on the bottom spacer layer and the straight channel portion of the vertical fin.

16. The method of claim 15, further comprising, removing the tapered upper portion of the vertical fin.

17. The method of claim 16, further comprising, forming a top source/drain on the straight channel portion.

18. The method of claim 17, wherein the bottom spacer layer is formed by a directional deposition.

* * * * *